US011411045B2

(12) United States Patent
Kataoka et al.

(10) Patent No.: US 11,411,045 B2
(45) Date of Patent: Aug. 9, 2022

(54) LIGHT EMITTING DEVICE AND DISPLAY

(71) Applicant: SONY CORPORATION, Tokyo (JP)

(72) Inventors: Yusuke Kataoka, Kanagawa (JP); Tatsuo Ohashi, Kanagawa (JP); Goshi Biwa, Kanagawa (JP); Akira Ohmae, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/617,752

(22) PCT Filed: Apr. 26, 2018

(86) PCT No.: PCT/JP2018/016987
§ 371 (c)(1),
(2) Date: Nov. 27, 2019

(87) PCT Pub. No.: WO2018/225418
PCT Pub. Date: Dec. 13, 2018

(65) Prior Publication Data
US 2020/0194494 A1 Jun. 18, 2020

(30) Foreign Application Priority Data
Jun. 6, 2017 (JP) .............................. JP2017-111525

(51) Int. Cl.
*H01L 27/15* (2006.01)
*H01L 33/32* (2010.01)
*H01L 33/38* (2010.01)

(52) U.S. Cl.
CPC ............ *H01L 27/156* (2013.01); *H01L 33/32* (2013.01); *H01L 33/38* (2013.01)

(58) Field of Classification Search
CPC combination set(s) only.
See application file for complete search history.

(56) References Cited

U.S. PATENT DOCUMENTS

| 4,199,385 A | 4/1980 | Hung et al. |
| 4,280,131 A | 7/1981 | Ono et al. |
| 7,098,059 B2 * | 8/2006 | Otoma ................... B82Y 20/00 |
| | | 438/28 |

(Continued)

FOREIGN PATENT DOCUMENTS

| CN | 102770798 A | 11/2012 |
| CN | 104756177 A | 7/2015 |

(Continued)

OTHER PUBLICATIONS

International Search Report and Written Opinion of PCT Application No. PCT/JP2018/016987, dated Jun. 12, 2018, 10 pages of ISRWO.

*Primary Examiner* — Ratisha Mehta
(74) *Attorney, Agent, or Firm* — Chip Law Group

(57) ABSTRACT

A light emitting device including a light emitting layer that is provided between a first face and a second face, a first electrode that is provided on the first face and is electrically coupled to the light emitting layer, a second electrode that is provided on the second face and is electrically coupled to the light emitting layer, and a non-selected electrode that is provided on the first face and is in a state not electrically coupled to a potential supply source.

16 Claims, 18 Drawing Sheets

(56) References Cited

U.S. PATENT DOCUMENTS

| | | | |
|---|---|---|---|
| 2008/0017878 A1* | 1/2008 | Kuramoto | H01L 33/38 257/99 |
| 2009/0001401 A1* | 1/2009 | Park | H01L 33/38 257/99 |
| 2011/0156065 A1* | 6/2011 | Kadan | H01L 33/382 257/88 |
| 2011/0254035 A1* | 10/2011 | Kim | H01L 33/385 257/98 |
| 2012/0299891 A1 | 11/2012 | Fujiwara et al. | |
| 2014/0015105 A1* | 1/2014 | Toba | H01L 29/34 257/615 |
| 2014/0077242 A1* | 3/2014 | Lee | H01L 33/60 257/98 |
| 2015/0069451 A1* | 3/2015 | Huang | H01L 33/382 257/99 |
| 2015/0076537 A1* | 3/2015 | Chou | H01L 33/04 257/96 |
| 2015/0293546 A1 | 10/2015 | Tanaka et al. | |
| 2015/0371597 A1* | 12/2015 | Shimmen | G09G 3/3607 345/690 |
| 2019/0067523 A1* | 2/2019 | Kinoshita | H01L 33/38 |

FOREIGN PATENT DOCUMENTS

| | | |
|---|---|---|
| CN | 107492357 A | 12/2017 |
| DE | 2910223 A1 | 10/1979 |
| EP | 2515161 A1 | 10/2012 |
| EP | 2902994 A1 | 8/2015 |
| JP | 54-123884 A | 9/1979 |
| JP | 05-347432 A | 12/1993 |
| JP | 2007-207977 A | 8/2007 |
| JP | 2009-027077 A | 2/2009 |
| JP | 2015-092529 A | 5/2015 |
| JP | 2016-186649 A | 10/2016 |
| KR | 10-2015-0079645 A | 7/2015 |
| NL | 7902080 A | 9/1979 |
| RU | 2012140472 A | 3/2014 |
| WO | 2011/104948 A1 | 9/2011 |
| WO | 2014/069529 A1 | 5/2014 |

\* cited by examiner

[ FIG. 1 ]
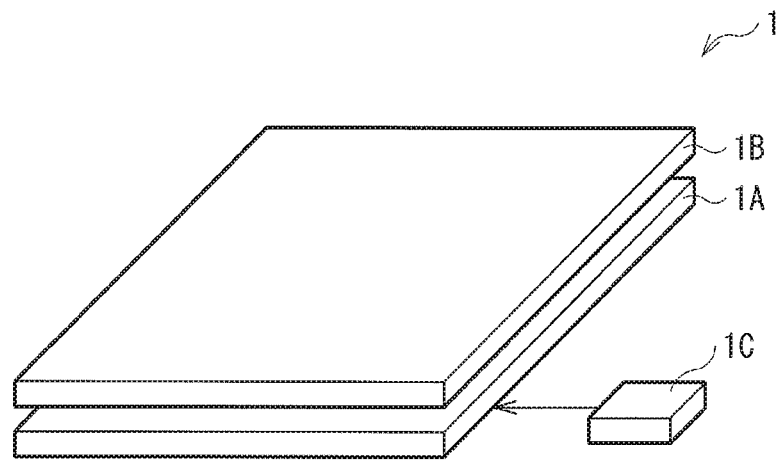
[ FIG. 2 ]
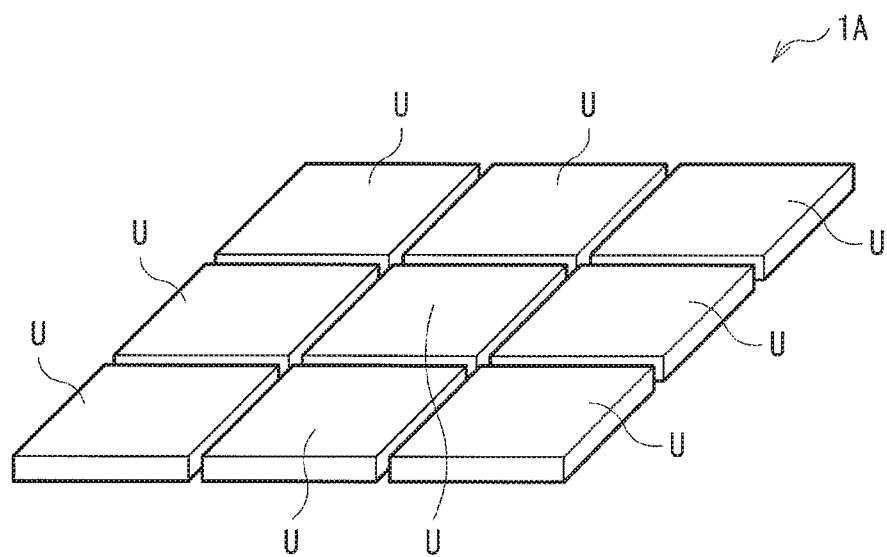

[FIG. 3]
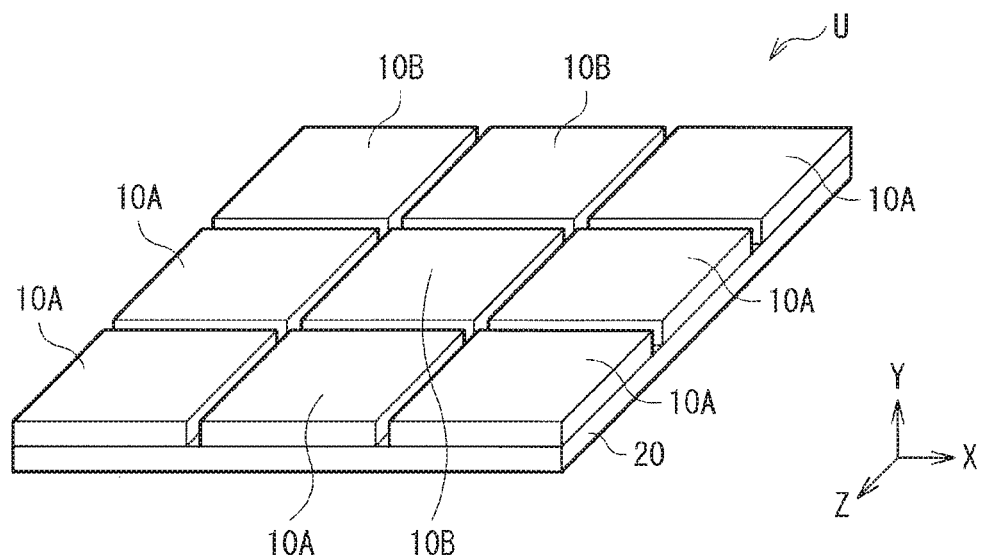
[FIG. 4]
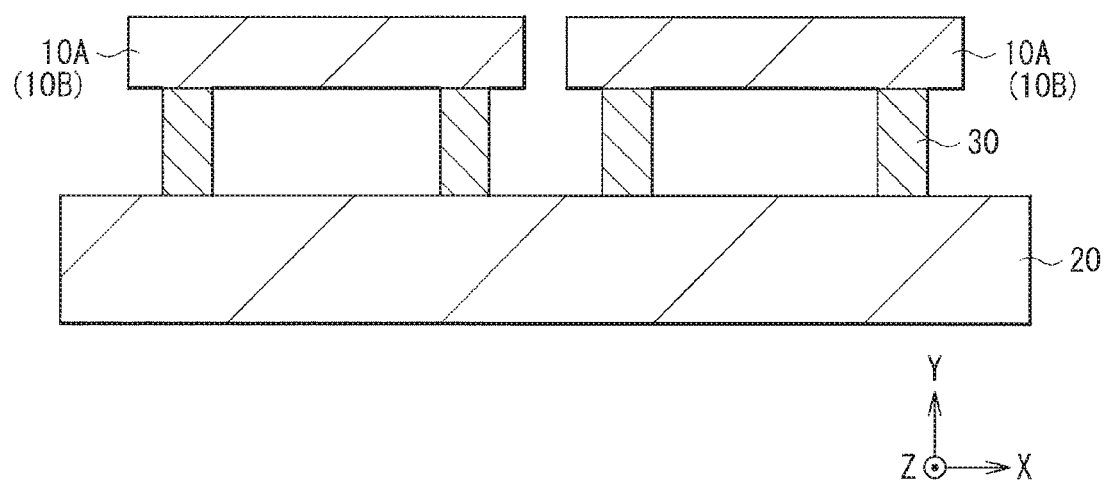

[ FIG. 5A ]
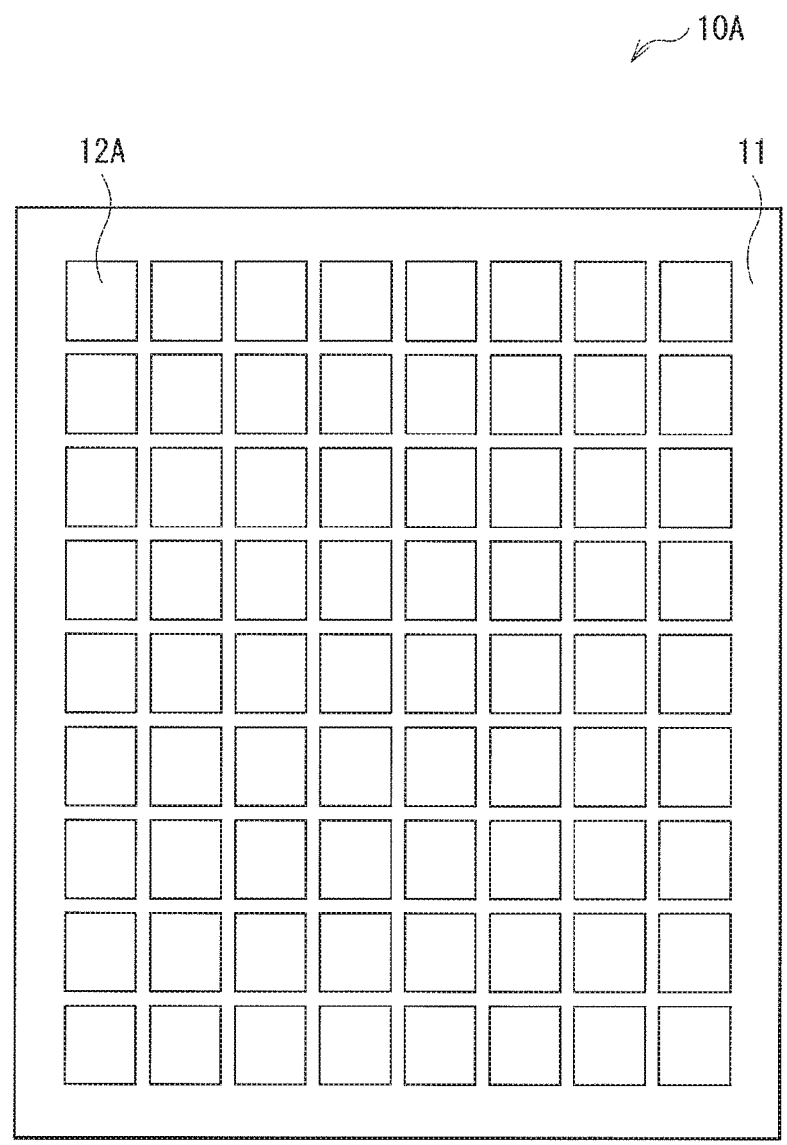

[ FIG. 5B ]
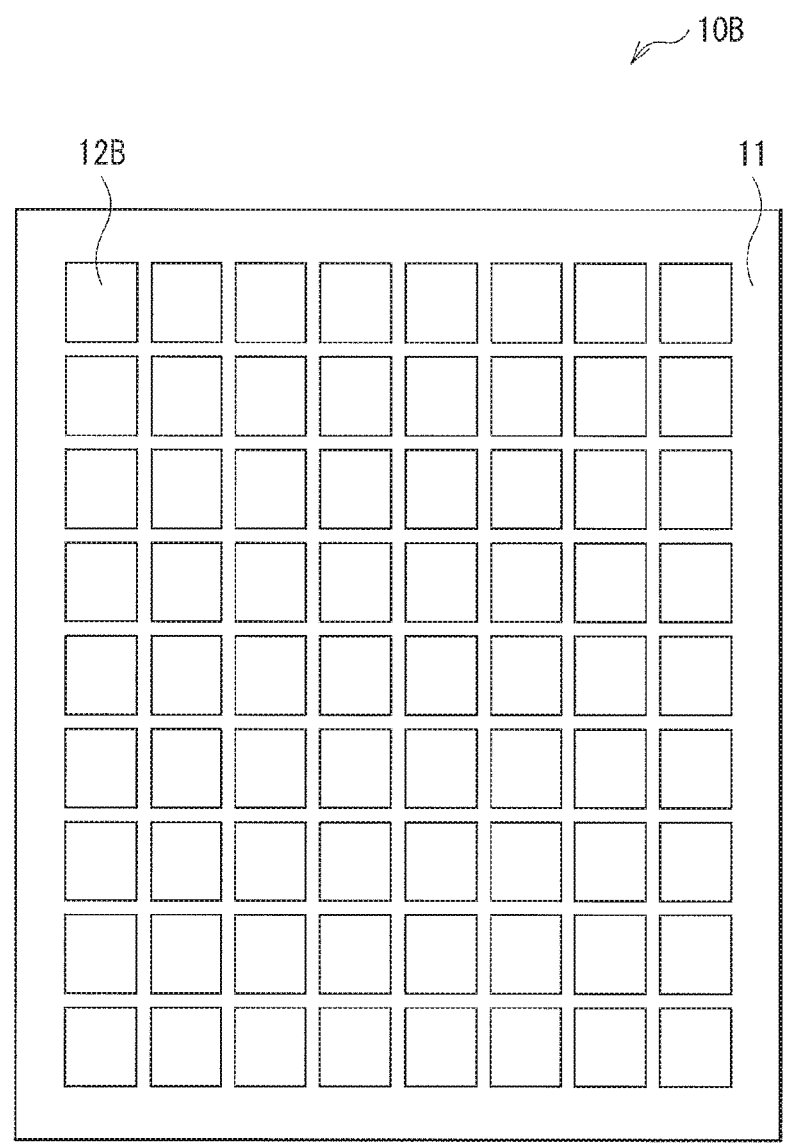

[ FIG. 6A ]
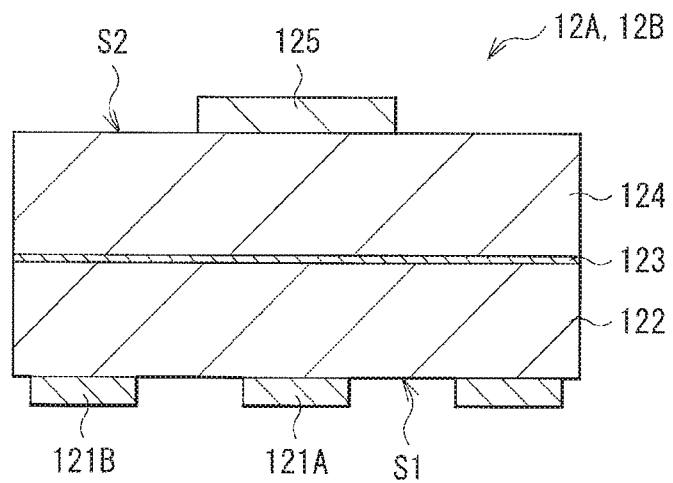
[ FIG. 6B ]
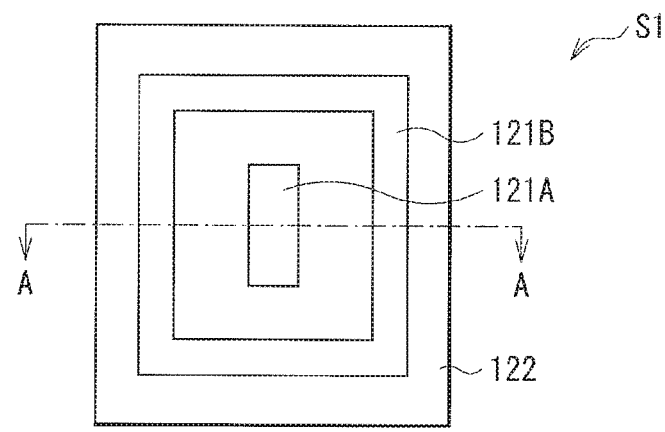
[ FIG. 6C ]
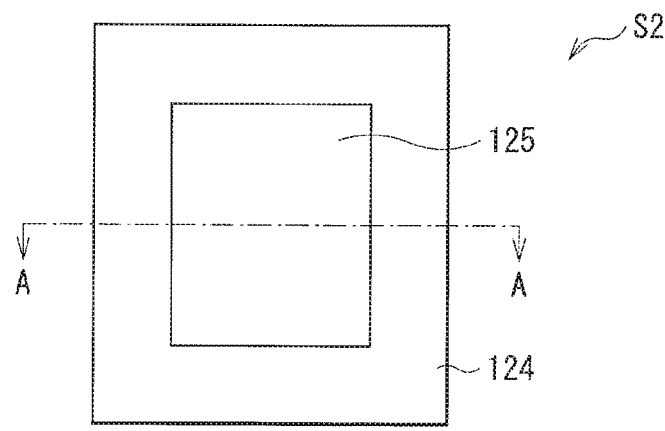

[ FIG. 7A ]
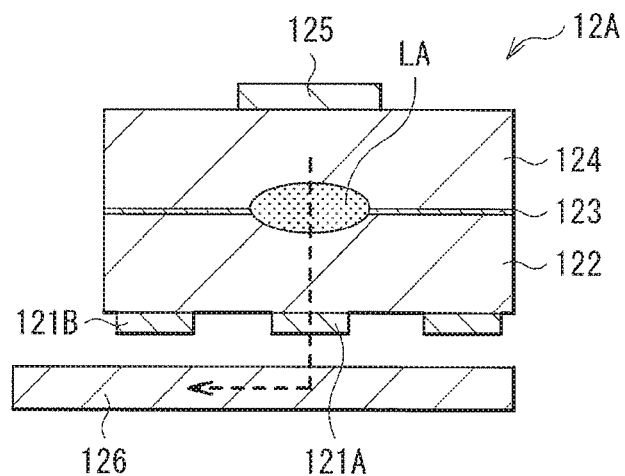
[ FIG. 7B ]
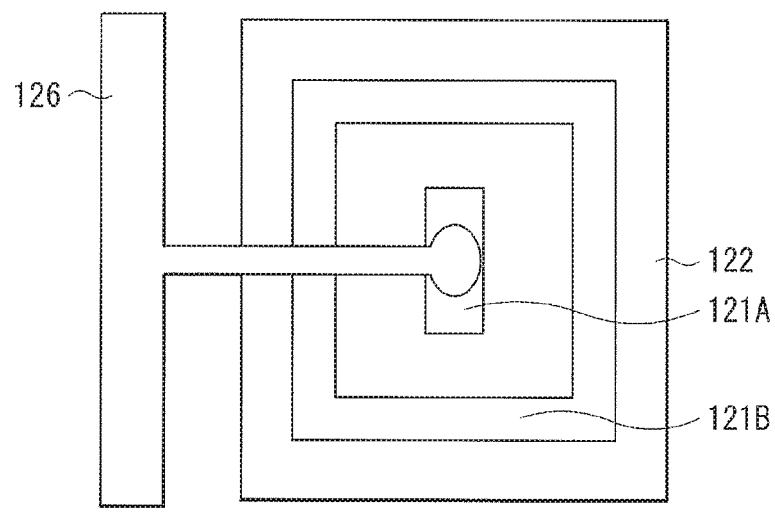

[ FIG. 8A ]
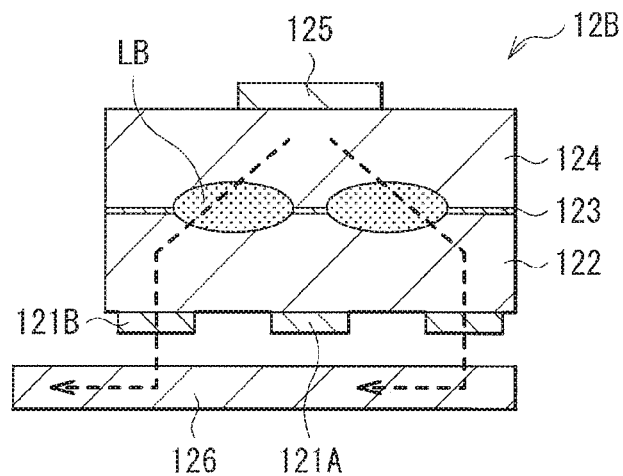
[ FIG. 8B ]
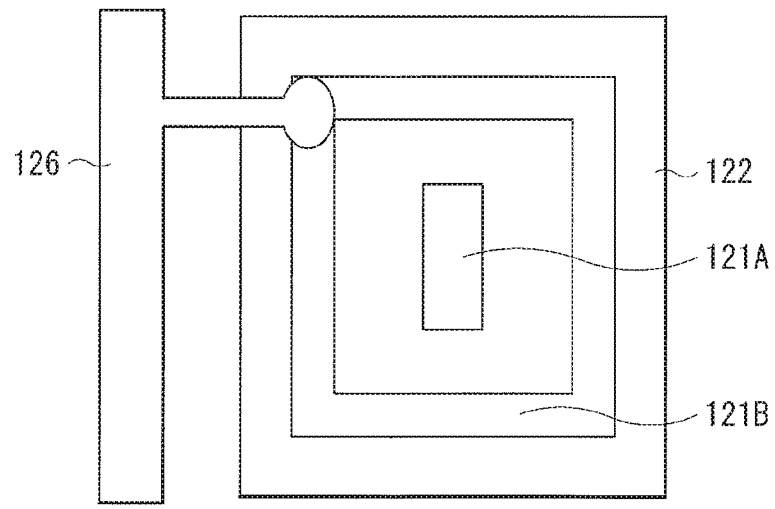

[ FIG. 9 ]
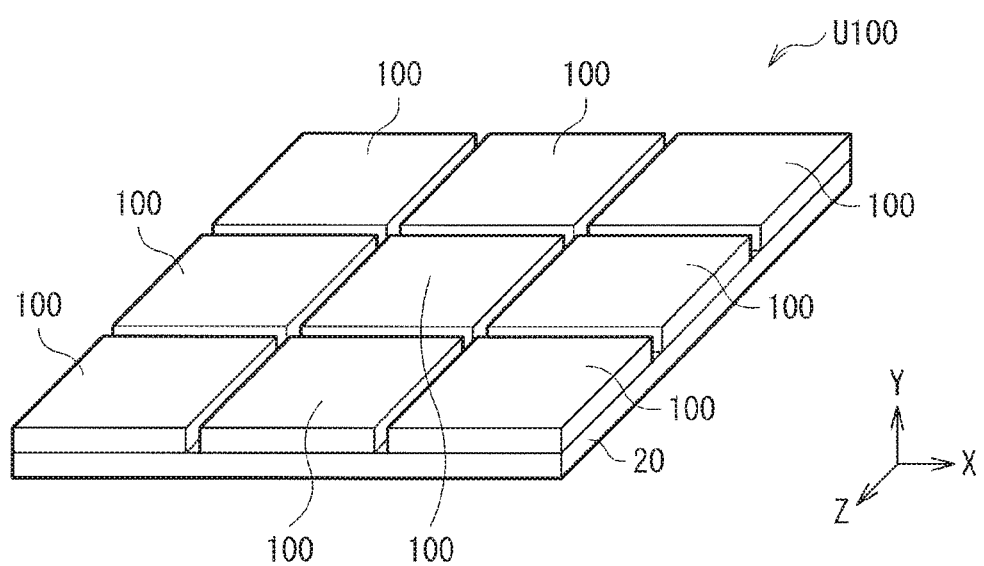

[ FIG. 10A ]
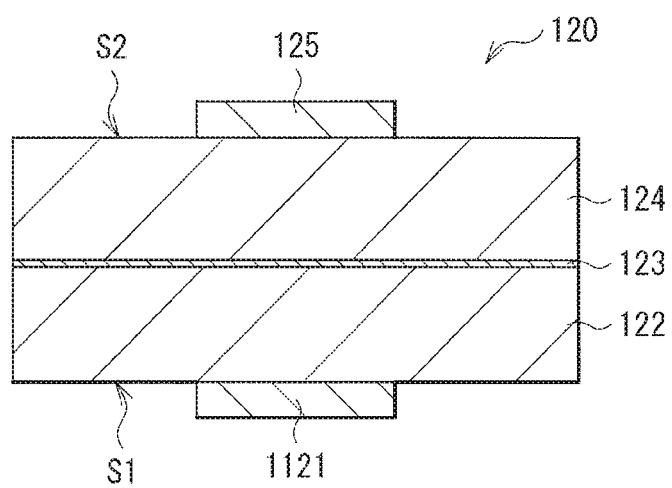
[ FIG. 10B ]
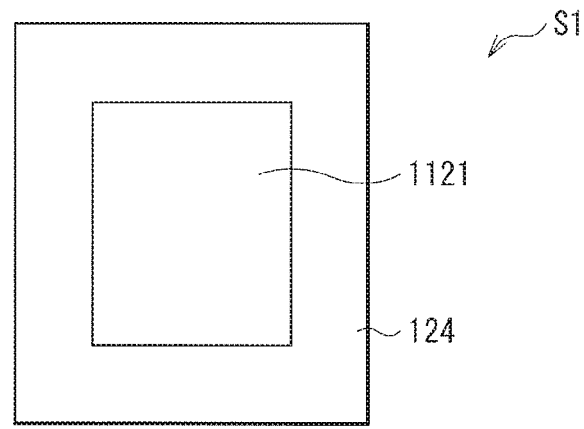

[FIG. 11]
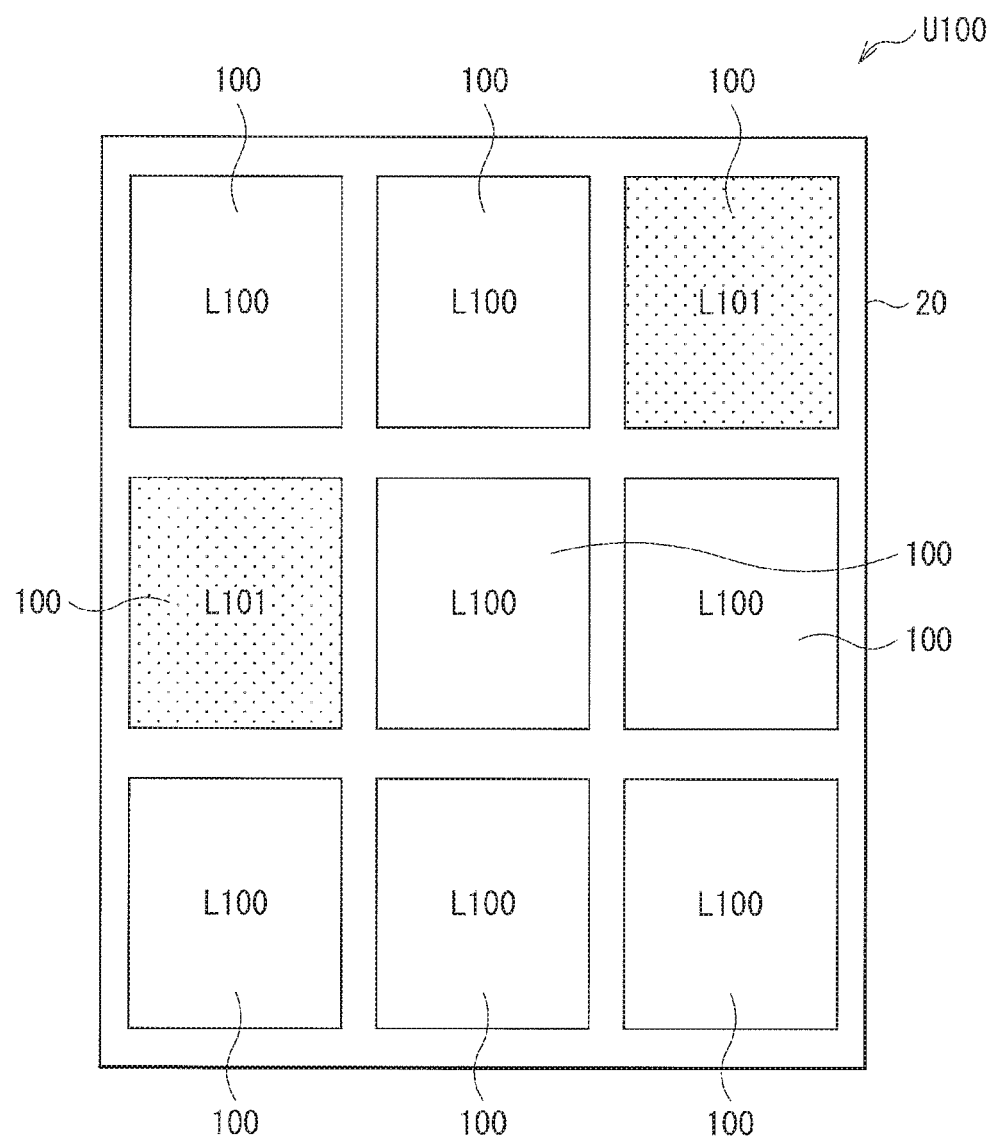

[ FIG. 12 ]
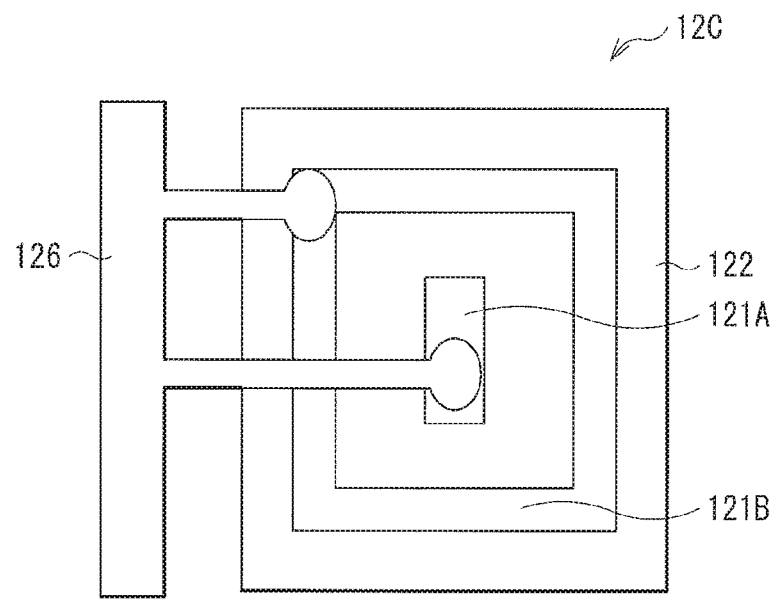
[ FIG. 13 ]
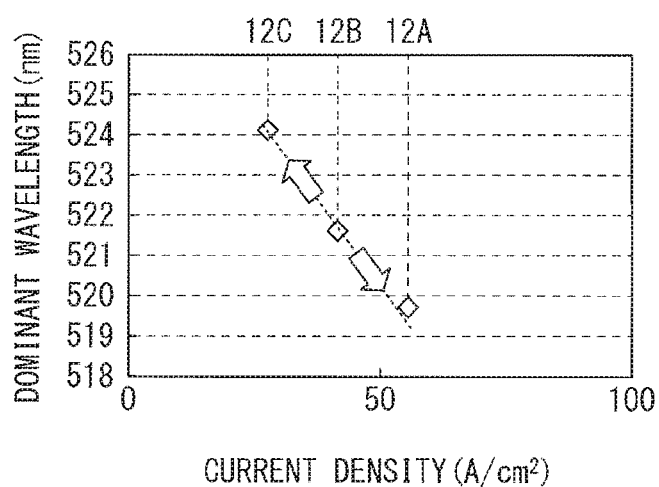

[ FIG. 14 ]
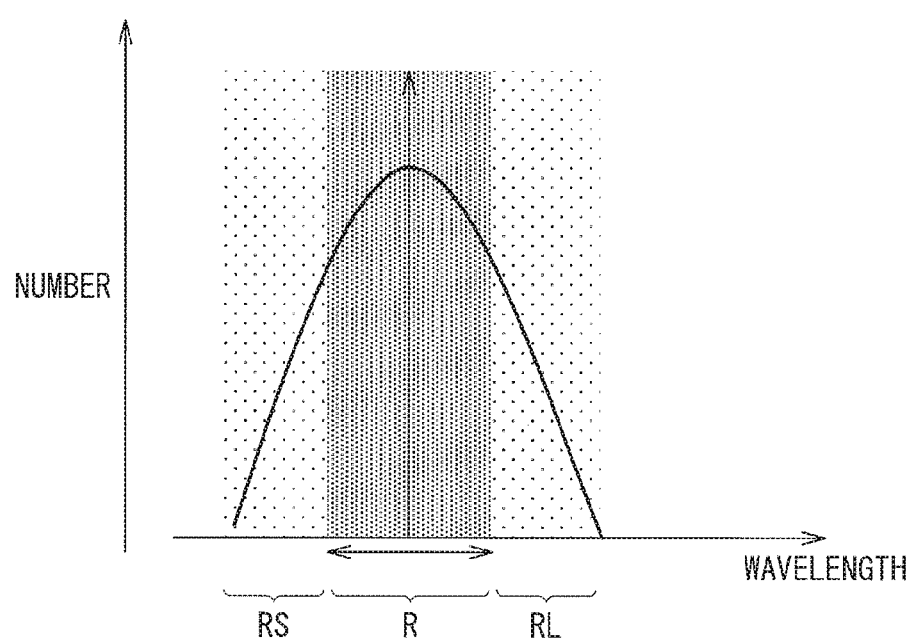

[ FIG. 15A ]
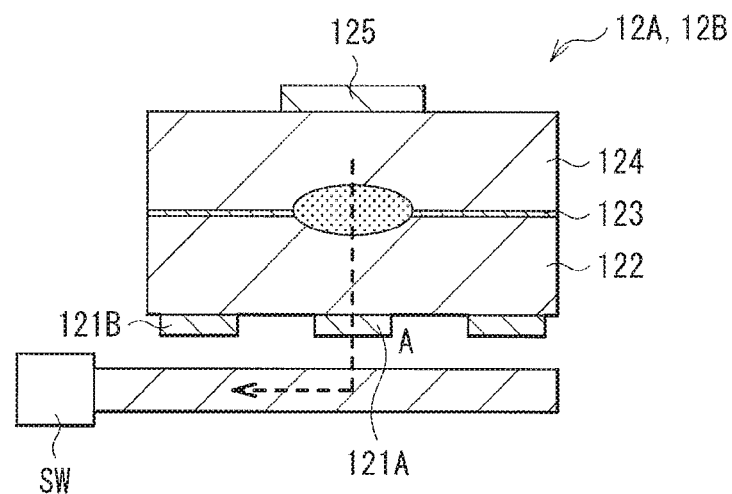
[ FIG. 15B ]
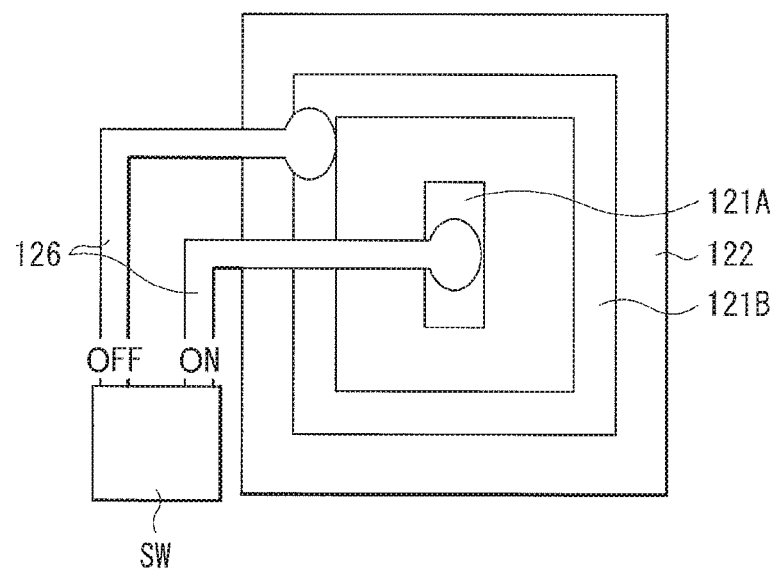

[ FIG. 16A ]
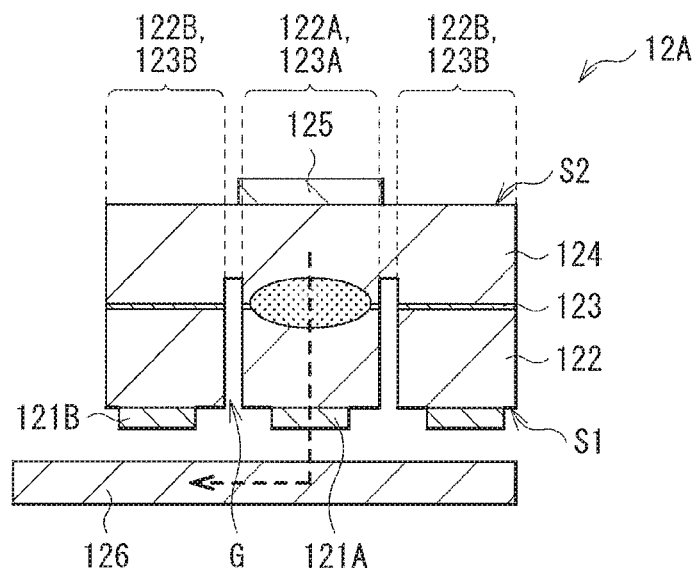
[ FIG. 16B ]
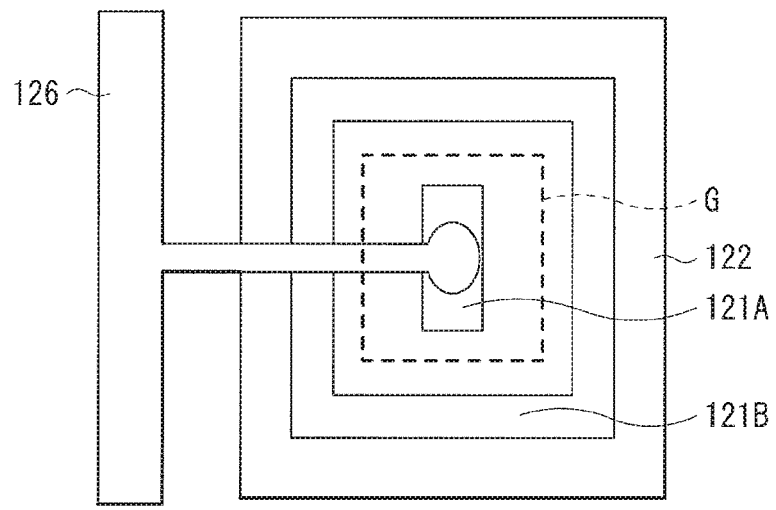

[ FIG. 17A ]
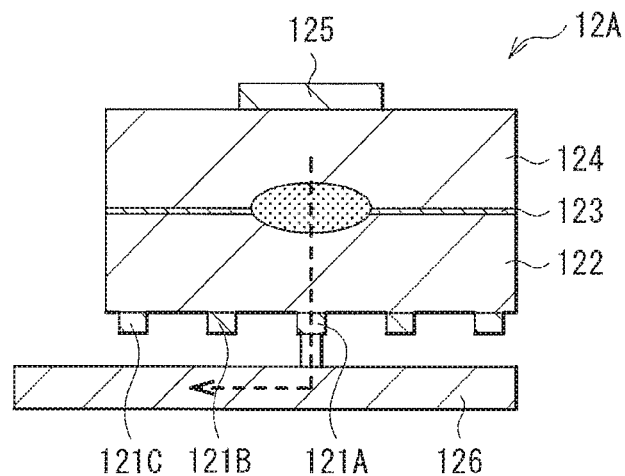
[ FIG. 17B ]
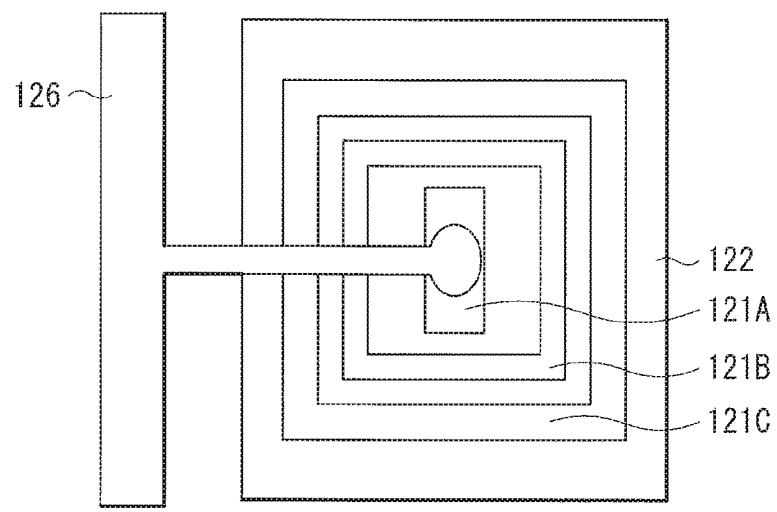

[ FIG. 18 ]
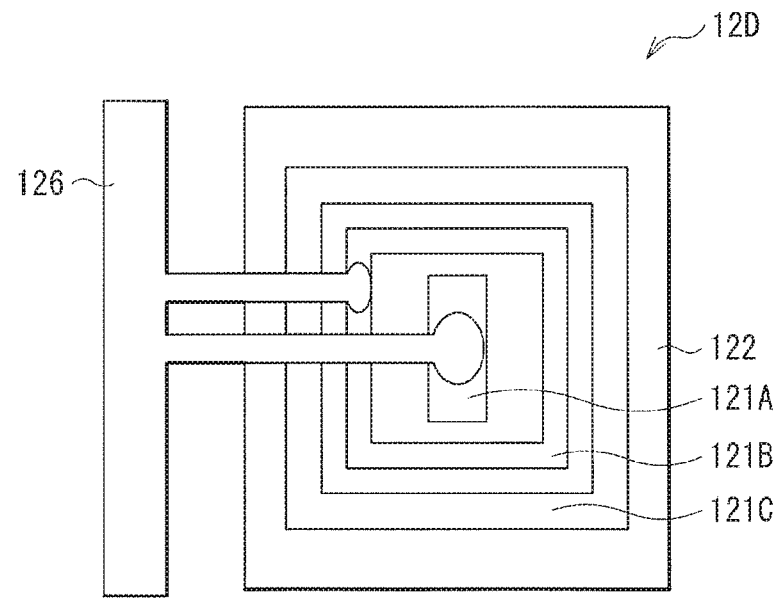
[ FIG. 19 ]
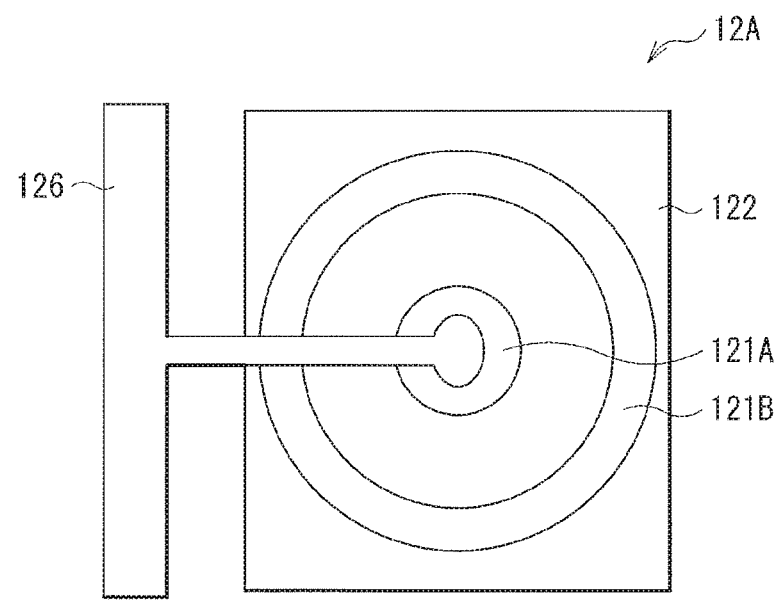

[ FIG. 20 ]
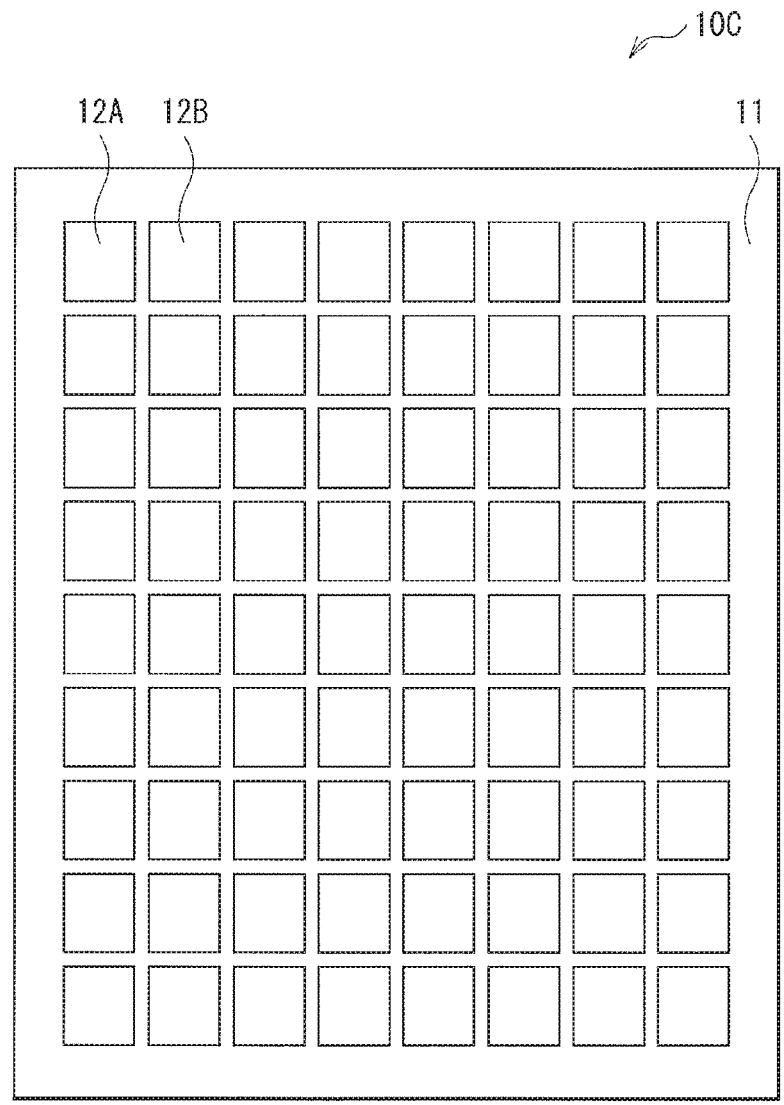
[ FIG. 21 ]
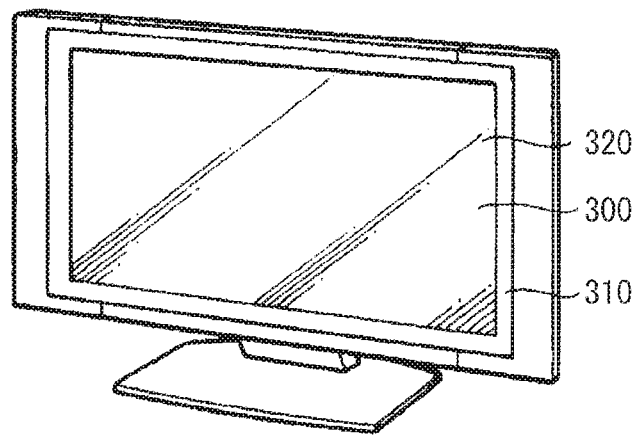

[ FIG. 22 ]
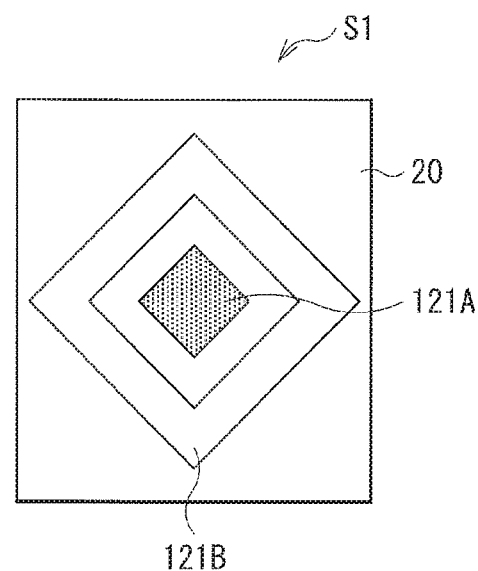
[ FIG. 23 ]
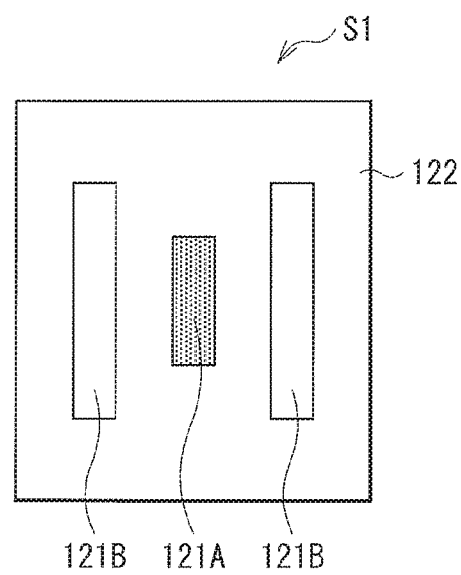

LIGHT EMITTING DEVICE AND DISPLAY

CROSS REFERENCE TO RELATED APPLICATIONS

This application is a U.S. National Phase of International Patent Application No. PCT/JP2018/016987 filed on Apr. 26, 2018, which claims priority benefit of Japanese Patent Application No. JP 2017-111525 filed in the Japan Patent Office on Jun. 6, 2017. Each of the above-referenced applications is hereby incorporated herein by reference in its entirety.

TECHNICAL FIELD

The present technology relates to a light emitting device and a display which are applicable to, for example, a tiling display and the like.

BACKGROUND ART

A self-light-emitting-type display panel which uses light emitting devices such as light emitting diodes (LEDs) has been developed (see, for example, PTL 1). It has been proposed to couple a plurality of such self-light-emitting-type display panels to provide a tiling display (display).

CITATION LIST

Patent Literature

PTL 1: Japanese Unexamined Patent Application Publication No. 2015-92529

SUMMARY OF THE INVENTION

It is desired that such a display improves image quality.

Therefore, it is desirable to provide a light emitting device and a display which are able to improve image quality.

A light emitting device according to one embodiment of the present technology includes: a light emitting layer that is provided between a first face and a second face; a first electrode that is provided on the first face and is electrically coupled to the light emitting layer; a second electrode that is provided on the second face and is electrically coupled to the light emitting layer; and a non-selected electrode that is provided on the first face and is in a state not electrically coupled to a potential supply source.

A display according to one embodiment of the present technology includes the light emitting device according to one embodiment of the present technology.

The light emitting device and the display according to one embodiment of the present technology each include a plurality of electrically-separated conductive films provided on the first face, and select a conductive film (first electrode) to which a potential is supplied according to a state of the light emitting layer. A conductive film to which the potential is not supplied out of the plurality of conductive films is a non-selected electrode.

The light emitting device and the display according to one embodiment of the present technology select the first electrode according to the state of the light emitting layer, and consequently are able to adjust a wavelength of light emitted from the light emitting device. This makes it possible to suppress variation between the wavelengths of the light emitted from a plurality of light emitting devices, and improve image quality. It is to be noted that an effect described herein is not necessarily limited, and may be any effect described in this disclosure may be provided.

BRIEF DESCRIPTION OF DRAWING

FIG. 1 is an exploded perspective view illustrating a schematic configuration of a display according to one embodiment of the present technology.

FIG. 2 is a perspective view illustrating a schematic configuration of an device substrate illustrated in FIG. 1.

FIG. 3 is a perspective view illustrating a schematic configuration of a unit illustrated in FIG. 2.

FIG. 4 is a cross-sectional schematic view illustrating the schematic configuration of the unit illustrated in FIG. 3.

FIG. 5A is a plan schematic view (1) illustrating a schematic configuration of a display panel illustrated in FIG. 3.

FIG. 5B is a plan schematic view (2) illustrating a schematic configuration of the display panel illustrated in FIG. 3.

FIG. 6A is a cross-sectional schematic view illustrating a common configuration between light emitting devices illustrated in FIGS. 5A and 5B.

FIG. 6B is a plan schematic view of a first face of the light emitting device illustrated in FIG. 6A.

FIG. 6C is a plan schematic view of a second face of the light emitting device illustrated in FIG. 6A.

FIG. 7A is a cross-sectional schematic view illustrating a configuration of the light emitting device illustrated in FIG. 5A.

FIG. 7B is a plan schematic view of the first face of the light emitting device illustrated in FIG. 7A.

FIG. 8A is a cross-sectional schematic view illustrating the configuration of the light emitting device illustrated in FIG. 6A.

FIG. 8B is a plan schematic view of the first face of the light emitting device illustrated in FIG. 8A.

FIG. 9 is a perspective view illustrating a schematic configuration of a unit according to a comparative example.

FIG. 10A is a cross-sectional schematic view illustrating a configuration of a light emitting device of a display panel illustrated in FIG. 9.

FIG. 10B is a plan schematic view illustrating a first face of the light emitting device illustrated in FIG. 10A.

FIG. 11 is a plan schematic view illustrating one example of a display state of the unit illustrated in FIG. 9.

FIG. 12 is a plan schematic view illustrating another example of the light emitting device illustrated in FIGS. 5A and 5B.

FIG. 13 is a diagram for explaining a wavelength of light emitted by the light emitting device illustrated in each of FIGS. 7B, 8B, and 12.

FIG. 14 is a diagram illustrating one example of a relationship between the number of manufactured light emitting devices and light emission wavelengths of the manufactured light emitting devices.

FIG. 15A is a cross-sectional schematic view illustrating a configuration of a light emitting device according to modification example 1.

FIG. 15B is a plan schematic view of a first face of the light emitting device illustrated in FIG. 15A.

FIG. 16A is a cross-sectional schematic view illustrating a configuration of a light emitting device according to modification example 2.

FIG. 16B is a plan schematic view of a first face of the light emitting device illustrated in FIG. 16A.

FIG. 17A is a cross-sectional schematic view illustrating a configuration of a light emitting device according to modification example 3.

FIG. 17B is a plan schematic view of a first face of the light emitting device illustrated in FIG. 17A.

FIG. 18 is a plan schematic view illustrating another example of a configuration of the light emitting device illustrated in FIG. 17B.

FIG. 19 is a plan schematic view illustrating a configuration of a light emitting device according to modification example 4.

FIG. 20 is a plan schematic view illustrating a configuration of a display panel according to modification example 5.

FIG. 21 is a diagram illustrating a configuration of an electronic apparatus (television apparatus) according to an application example.

FIG. 22 is a plan schematic view illustrating another example (1) of the configuration of the light emitting device illustrated in FIG. 6B.

FIG. 23 is a plan schematic view illustrating another example (2) of the configuration of the light emitting device illustrated in FIG. 6B.

MODES FOR CARRYING OUT THE INVENTION

An embodiment of the present technology will be described in detail below with reference to the drawings. In this regard, the embodiment will be described in the following order.
1. Embodiment (a display including light emitting devices including non-selected electrodes)
2. Modification Example 1 (an example of a light emitting device coupled to a switching device)
3. Modification Example 2 (an example of a light emitting device having a groove)
4. Modification Example 3 (an example of a light emitting device whose first electrode or non-selected electrode includes a plurality of conductive films)
5. Modification Example 4 (an example of a light emitting device in which a planar shape of the first electrode or the non-selected electrode is circular)
6. Modification Example 5 (an example of a display panel including light emitting devices whose conductive films A function as the first electrodes, and light emitting devices whose conductive films B function as the first electrodes)

EMBODIMENT

FIG. 1 schematically illustrates an overall configuration of a display (display 1) according to one embodiment of the present technology. This display 1 includes, for example, a device substrate 1A, an opposing substrate 1B which is opposed to the device substrate 1A, and a control circuit 1C which is directed to drive the device substrate 1A. For example, a surface (an opposite face to a face opposed to the device substrate 1A) of the opposing substrate 1B is an image display surface. A middle of this image display surface is a display region, and a portion surrounding the display region is a non-display region. The opposing substrate 1B is configured to allow transmission of light of a wavelength in a visible range. The opposing substrate 1B includes, for example, a light transmissive material such as a glass substrate, a transparent resin substrate, or a transparent resin film.

FIG. 2 schematically illustrates one example of a configuration of the device substrate 1A illustrated in FIG. 1. The display 1 is a so-called tiling display. The device substrate 1A includes a plurality of units (units U) closely laid in a tile pattern. FIG. 2 illustrates, as an example, a case where the device substrate 1A includes nine units U. However, the number of the units U may be ten or more or may be eight or less.

FIG. 3 schematically illustrates one example a configuration of the unit U. The unit U includes, for example, a plurality of display panels (display panels 10A and 10B) closely laid in a tile pattern, and a support substrate (support substrate 20) of these display panels 10A and 10B. An opposite face to a display surface of each of the display panels 10A and 10B is opposed to the support substrate 20. The support substrate 20 includes, for example, a metal plate.

FIG. 4 schematically illustrates one example of a configuration between the display panels 10A and 10B and the support substrate 20. The display panels 10A and 10B are fixed to the support substrate 20 by, for example, fixing members (fixing members 30).

FIG. 5A illustrates a schematic planar configuration of the display panel 10A, and FIG. 5B illustrates a schematic planar configuration of the display panel 10B. The display panel 10A includes a plurality of light emitting devices (light emitting devices 12A) on a mounting substrate (mounting substrate 11). The display panel 10B includes a plurality of light emitting devices (light emitting devices 12B) on the mounting substrate 11. Each of the light emitting devices 12A and 12B in each of the display panels 10A and 10B is coupled to a drive circuit.

FIGS. 6A, 6B, and 6C schematically illustrate a common configuration between the light emitting devices 12A and the light emitting devices 12B. FIG. 6A illustrates a cross-sectional configuration of the light emitting devices 12A and 12B, FIG. 6B illustrates a planar configuration of one face (a first face S1 described below) of each of the light emitting devices 12A and 12B, and FIG. 6C illustrates a planar configuration of the other face (a second face S2 described below) of each of the light emitting devices 12A and 12B. The light emitting devices 12A and 12B each include, for example, a first face (first face S1) and a second face (second face S2) that are opposed to each other, and include a first semiconductor layer 122, a light emitting layer 123, and a second semiconductor layer 124 between these first face and second face in order from a position close to the first face S1. Shapes of the first face S1 and the second face S2 are, for example, square shapes. The shape of the first face S1 and the shape of the second face S2 may be different. The first face S1 of each of the light emitting devices 12A and 12B includes a conductive film A121A and a conductive film B121B, and the second face S2 includes a second electrode 125. As described below, any one of the conductive film A121A and the conductive film B121B functions as a first electrode of each of the light emitting devices 12A and 12B. Light (light LA and light LB in FIGS. 7A and 8A described below) is extracted from, for example, the second faces S2 in the light emitting devices 12A and 12B. Light may be extracted from the first faces S1. The light emitting devices 12A and 12B emit, for example, light in a blue wavelength range or light in a green wavelength range. The display panels 10A and 10B each include light emitting devices which emit light in a red wavelength range together with the light emitting devices 12A and 12B.

The conductive film A121A and the conductive film B121B are provided in regions different from each other of the first face S1, and are electrically separated. The conductive film A121A and the conductive film B121B differ in one or more of shape (including size, too), electrode area, constituent material, etc. A current density of a current flowing via the conductive film A121A differs from a current density of a current flowing via the conductive film B121B. The conductive film A121A and the conductive film B121B preferably have rotationally-symmetrical planar shapes. A center of the symmetry is preferably located at a center of the first face S1. This makes it possible to improve light distribution characteristics. The conductive film A121A is provided at, for example, a middle of the first face S1. The planar shape of the conductive film A121A is a square shape (FIG. 6B). The planar shape of the conductive film B121B is, for example, a frame square shape which surrounds a periphery of this conductive film A121A. That is, for example, the conductive film A121A and the conductive film B121B have four-fold symmetric planar shapes. The conductive film A121A and the conductive film B121B may have quadrangular planar shapes such as rectangular shapes. For example, an electrode area of the conductive film B121B is larger than an electrode area of the conductive film A121A. The current density of the current flowing via the conductive film B121B is smaller than the current density of the current flowing via the conductive film A121A.

FIGS. 7A and 7B schematically illustrate a configuration of the light emitting device 12A, and FIGS. 8A and 8B schematically illustrate a configuration of the light emitting device 12B. FIGS. 7A and 8A illustrate cross-sectional configurations of the light emitting devices 12A and 12B, respectively, and FIGS. 7B and 8B illustrate planar configurations of the first faces S1 of the light emitting devices 12A and 12B, respectively. The conductive film A121A in the light emitting device 12A is coupled to a wiring line (wiring line 126) which is directed to supplying of a potential. That is, the conductive film A121A is electrically coupled to the light emitting layer 123 via the first semiconductor layer 122, and functions as the first electrode. In this case, the conductive film B121B does not receive a supply of the potential, and the conductive film B121B is a non-selected electrode. That is, the conductive film B121B is in a state not coupled to the potential supply source. The light emitting layer 123 of the light emitting device 12A generates the light LA in a case where a predetermined voltage is applied between the conductive film A121A and the second electrode 125. The conductive film B121B in the light emitting device 12B is coupled to the wiring line 126. That is, the conductive film B121B is electrically coupled to the light emitting layer 123 via the first semiconductor layer 122, and functions as the first electrode. In this case, the conductive film A121A does not receive a supply of the potential, and the conductive film A121A is a non-selected electrode. That is, the conductive film A121A is in a state not coupled to the potential supply source. In a case where a predetermined voltage is applied between the conductive film B121B and the second electrode 125, the current density becomes lower than that of the light emitting device 12A (conductive film A121A), and therefore the light emitting layer 123 of the light emitting device 12B generates the light LB of a wavelength longer than that of the light LA. Thus, the light emitting device 12A and the light emitting device 12B differ in the conductive films (the conductive film A121A and the conductive film B121B) which function as the first electrodes.

As described in detail below, according to the present embodiment, a plurality of electrically-separated conductive films (the conductive film A121A and the conductive film B121B) is provided on the first face S1 in this way. This makes it possible to select the conductive film which functions as the first electrode. This makes it possible to adjust the wavelength of light (light LA and light LB) generated in the light emitting layer 123.

FIG. 3 illustrates, as an example, a case where the one unit U includes the display panels 10A (light emitting devices 12A) and the display panels 10B (light emitting devices 12B). However, the one unit U may include only the display panels 10A or only the display panels 10B.

The conductive film A121A and the conductive film B121B are provided in contact with the first semiconductor layer 122. The conductive film A121A and the conductive film B121B include, for example, a conductive metal material. The conductive metal material is, for example, titanium (Ti), platinum (Pt), gold (Au), etc. It is possible to use, for example, a laminated layer film of titanium (Ti)/platinum (Pt)/gold (Au) for the conductive film A121A and the conductive film B121B. The conductive film A121A and the conductive film B121B may include, for example, a conductive oxide such as an indium tin oxide (ITO) or an indium zinc oxide (IZO). It is possible to use, for example, a laminated film of ITO/IZO for the conductive film A121A and the conductive film B121B. The conductive film A121A and the conductive film B121B may be formed as single films. A constituent material of the conductive film A121A and a constituent material of the conductive film B121B may be different. The display panel 10A includes the first electrode (conductive film A121A) in which all of the light emitting devices 12A have the same shape and the same constituent material. The display panel 10B includes the first electrode (conductive film B121B) in which all of the light emitting devices 12A have the same shape and the same constituent material. Hence, all of the light emitting devices 12A in the display panel 10A simultaneously perform a process of coupling the conductive films A121A and the wiring line 126. All of the light emitting devices 12B in the display panel 10B simultaneously perform a process of coupling the conductive films B121B and the wiring line 126.

The first semiconductor layer 122 provided to each of the light emitting devices 12A and 12B includes, for example, a p-type InGaN-based semiconductor material. It is possible to use, for example, p-type GaN for the first semiconductor layer 122. The first semiconductor layer 122 coupled to the conductive film A121A and the conductive film B121B preferably has a high resistance. For example, by using the first semiconductor layer 122 such as the p-type GaN having a high resistance value, it is possible to suppress diffusion of the current flowing from the conductive film A121A and the conductive film B121B to the light emitting layer 123. A planar shape of the first semiconductor layer 122 is, for example, a square shape, and a surface (an opposite face to a face opposed to the second semiconductor layer 124) of the first semiconductor layer 122 provides the first face S1.

The light emitting layer 123 between the first semiconductor layer 122 and the second semiconductor layer 124 includes, for example, an InGaN-based semiconductor material. It is possible to use, for example, InGaN for the light emitting layer 123.

The second semiconductor layer 124 opposes the first semiconductor layer 122 with the light emitting layer 123 interposed therebetween. This second semiconductor layer 124 includes, for example, an n-type InGaN-based semiconductor material. It is possible to use, for example, n-type GaN for the second semiconductor layer 124. A planar shape of the second semiconductor layer 124 is, for example, a square shape, and the surface of the second semiconductor layer 124 provides the second face S2.

The second electrode 125 is provided in contact with the second semiconductor layer 124, and is electrically coupled to the light emitting layer 123 via the second semiconductor layer 124. The second electrode 125 is provided at, for example, a middle of the second face S2, and has a quadrangular planar shape. The second electrode 125 includes, for example, a conductive metal material or an oxide, as with the conductive film A121A and the conductive film B121B. It is possible to use, for example, a laminated film of titanium (Ti)/platinum (Pt)/gold (Au) for the second electrode 125. The second electrode 125 may be provided as a single film.

In a case where a predetermined voltage is applied between the conductive film A121A or the conductive film B121B and the second electrode 125 in these light emitting devices 12A and 12B, electrons and holes are injected in the light emitting layer 123 respectively from side of the second electrode 125 and side of the conductive film A121A or the conductive film B121B. Recombination of the electrons and the holes injected in this light emitting layer 123 generate photons, become emission light (light LA and light LB), and are extracted from the second face S2. In this regard, the light emitting devices 12A and 12B include a plurality of conductive films (the conductive films A121A and the conductive films B121B). This makes it possible to select the conductive film that is caused to function as the first electrode according to a state of the light emitting layer 123. That is, by selecting any one of the conductive film A121A and the conductive film B121B of the different current densities, it is possible to adjust the wavelengths of the light LA and LB emitted from the light emitting devices 12A and 12B. Consequently, it is possible to select the display panel 10A or the display panel 10B, and suppress generation of a visual border between a plurality of display panels 10A and 10B. This will be described in detail below.

FIG. 9 illustrates a schematic configuration of a unit (unit U100) according to a comparative example. This unit U100 includes a plurality of display panels (display panels 100) closely laid in a tile pattern. All of the display panels 100 employ the same configuration. The plurality of display panels 100 is provided on the support substrate 20.

FIGS. 10A and 10B schematically illustrate a configuration of a light emitting device (light emitting device 120) included in the display panel 100. FIG. 10A illustrates a cross-sectional configuration of the light emitting device 120, and FIG. 10B illustrates a planar configuration of the first face S1 of the light emitting device 120. A single conductive film (conductive film 1121) is provided on the first face S1 of this light emitting device 120. In this regard, the light emitting device 120 differs from the light emitting devices 12A and 12B. Only this conductive film 1121 functions as the first electrode, and therefore the light emitting device 120 is not able to vary a current density. Hence, there is a possibility that the state of the light emitting layer 123 causes a great variation of the wavelength of light (light L100 and light L101 in FIG. 11 described below) emitted from the light emitting device 120. The light emitting device 120 whose light emitting layer 123 includes an InGaN-based semiconductor material in particular has difficulty in uniformly growing semiconductor layers (e.g., the first semiconductor layer 122, the light emitting layer 123, and the second semiconductor layer 124), and the variation of the wavelength of light emitted from the light emitting device 120 tends to become great.

FIG. 11 schematically illustrates a display state of the unit U100. In a case where one of the neighboring display panels 100 emits the light L100, and the other one emits the light L101 having a wavelength greatly different from that of the light L100, a wavelength difference between the light L100 and the light L101 causes a visual level difference. This visual level difference causes a visual border between the neighboring display panels 100, and greatly lowers image quality.

There may be also considered a method for selecting and using the light emitting device 120 according to a light emission wavelength. There is, for example, bin classification as the selecting method. However, selecting and using the light emitting device 120 increases the number of processes and, furthermore, the light emitting devices 120 which are not able to be used are discarded. Therefore, cost increases.

By contrast with this, the display 1 includes a plurality of conductive films (the conductive films A121A and the conductive films B121B) on the first faces S1 of the light emitting devices 12A and 12B, and consequently is able to select a conductive film which is caused to function as the first electrode according to the state of the light emitting layer 123. A current of a higher current density is injected in the light emitting layer 123 in the light emitting device 12A whose conductive film A121A functions as the first electrode. A current of a lower current density is injected in the light emitting layer 123 in the light emitting device 12B whose conductive film B121B functions as the first electrode. Consequently, it is possible to vary the current density according to the state of the light emitting layer 123, and make variation of the wavelengths of the light LA and the light LB emitted between the plurality of light emitting devices 12A and 12B (display panels 10A and 10B) fall within a predetermined range.

As illustrated in FIG. 12, the display 1 may include a light emitting device (light emitting device 12C) in which both of the conductive film A121A and the conductive film B121B function as the first electrodes. The wiring line 126 in the light emitting device 12C is coupled to the conductive film A121A and the conductive film B121B, and the conductive film A121A and the conductive film B121B receive a supply of the potential. The current density of the current flowing via both of the conductive film A121A and the conductive film B121B is lower than the current density of the current flowing via one of the conductive film A121A and the conductive film B121B. Consequently, by using the light emitting device 12C in combination with the light emitting devices 12A and 12B, it is possible to vary the current density in a wider range.

FIG. 13 illustrates a relationship between the current densities of the light emitting devices 12A, 12B, and 12C, and a dominant wavelength. The current density of the current injected from the first electrode (conductive film A121A) in the light emitting device 12A is approximately 1.5 times as that of the light emitting device 12B (conductive film B121B). The wavelength of the light LA emitted from the light emitting device 12A becomes approximately 2 nm shorter than the wavelength of the light LB emitted from the light emitting device 12B. Thus, by causing one of the conductive film A121A and the conductive film B121B to function as the first electrode, it is possible to vary the current density and adjust the wavelengths of the light LA and LB. Consequently, it is possible to make the variation of the wavelengths of the light LA and the light LB fall within the predetermined range, and suppress generation of a visual border between the plurality of display panels 10A and 10B.

Furthermore, by adjusting the wavelengths of the light LA and the light LB, it is possible to increase the number of the light emitting devices 12A and 12B which satisfy a criterion of the light emission wavelength. Consequently, it is possible to reduce manufacturing cost.

FIG. 14 illustrates a relationship between the wavelength of light emitted from manufactured light emitting devices, and the number of manufactured light emitting devices. Use of a light emitting device whose range of the light emission wavelength after manufacturing is a range RS on a short wavelength side compared to an acceptable range R, and a light emitting device whose range of the light emission wavelength after manufacturing is a range RL on a long wavelength side compared to the acceptable range R greatly lowers image quality as described above. Furthermore, in a case where only light emitting devices within the acceptable range R are selected, the number of processes increases, and cost increases. By contrast with this, by selecting which one of the conductive film A121A and the conductive film B121B is caused to function as the first electrode, it is possible to make the light emission wavelengths of the light emitting devices within the range RS and the range RL fall within the acceptable range R. Consequently, the display 1 is able to suppress cost. Furthermore, even if a light emitting device selection process is added, it is possible to set a high criterion and consequently further improve image quality.

As described above, according to the present embodiment, the first electrode is selected from the conductive film A121A and the conductive film B121B according to the state of the light emitting layer 123. This makes it possible to adjust the wavelengths of the light LA and the light LB emitted from the light emitting devices 12A and 12B. Consequently, it is possible to suppress variation of the wavelengths of the light LA and the light LB emitted from the plurality of light emitting devices 12A and 12B, and improve image quality.

Furthermore, the conductive film A121A and the conductive film B121B have the rotationally-symmetrical planar shapes. This makes it possible to improve light distribution characteristics.

Furthermore, the same conductive films A121A (or conductive films B121B) in all of the light emitting devices 12A (or the light emitting devices 12B) in the display panel 10A (or in the display panel 10B) are coupled to the wiring line 126. This makes it possible to simultaneously perform a coupling process of the conductive films A121A in all of the light emitting devices 12A (or the light emitting devices 12B). Consequently, it is possible to simply manufacture the display 1.

Modification examples of the above-described embodiment will be described below, and the same components as those in the above-described embodiment will be assigned the same reference numerals in the following description, and description thereof will be omitted as appropriate.

Modification Example 1

FIGS. 15A and 15B schematically illustrate a configuration of the light emitting devices 12A and 12B according to modification example 1 of the above-described embodiment. FIG. 15A illustrates a cross-sectional configuration of the light emitting devices 12A and 12B, and FIG. 15B illustrates a planar configuration of the light emitting devices 12A and 12B. The conductive film A121A and the conductive film B121B may be coupled to a switching device (switching device SW) in this way. The light emitting devices 12A and 12B according to modification example 1 have a configuration and an effect similar to those of the light emitting devices 12A and 12B according to the above-described embodiment except this point.

The wiring line 126 is coupled to the conductive film A121A and the conductive film B121B. The switching device SW performs switching to select the conductive film A121A and the conductive film B121B to which the potential is supplied. That is, the switching device SW performs switching to select the conductive film A121A or the conductive film B121B which functions as the first electrodes.

Modification Example 2

FIGS. 16A and 16B schematically illustrate a configuration of the light emitting devices 12A and 12B according to modification example 2 of the above-described embodiment. FIG. 16A illustrates a cross-sectional configuration of the light emitting devices 12A and 12B, and FIG. 16B illustrates a planar configuration of the light emitting devices 12A and 12B. Thus, portions of semiconductor layers (a first semiconductor layer 122A and a light emitting layer 123A) which overlap the conductive film A121A in a plan view may be separated from portions of semiconductor layers (a first semiconductor layer 122B) and a light emitting layer 123B) which overlap the conductive film B121B. The light emitting devices 12A and 12B according to modification example 2 have a configuration and an effect similar to those of the light emitting devices 12A and 12B according to the above-described embodiment except this point.

The light emitting devices 12A and 12B have a groove (groove G) provided perpendicularly from the first face S1. This groove G is provided between the conductive film A121A and the conductive film B121B, and has a quadrangular shape in the plan view. The groove G penetrates the first semiconductor layer 122 and the light emitting layer 123 in a thickness direction from the first face S1, and extends to, for example, a portion of the second semiconductor layer 124. By providing such a groove G, the portions of the first semiconductor layer 122A and the light emitting layer 123A which overlap the conductive film A121A in the plan view, and the portions of the first semiconductor layer 122B and the light emitting layer 123B which overlap the conductive film B121B are electrically separated.

The current is injected from the conductive film A121A to the light emitting layer 123A via the first semiconductor layer 122A in the light emitting device 12A having the groove G. The current is injected from the conductive film B121B to the light emitting layer 123B via the first semiconductor layer 122B in the light emitting device 12B having the groove G. By providing the groove G, the first semiconductor layer 122A and the first semiconductor layer 122B are electrically separated. This makes it possible to suppress diffusion of the current from the conductive film A121A and the conductive film B121B to the light emitting layers 123A and 123B. Consequently, it is possible to use the first semiconductor layer 122 of a lower resistance value.

As with the present modification example, the semiconductor layers may be electrically separated at the portion which overlaps the conductive film A121A and the portion which overlaps the conductive film B121B in the plan view. In this case, it is also possible to obtain the equivalent effect to that of the above-described embodiment. Furthermore, it is possible to suppress the diffusion of the current from the conductive film A121A and the conductive film B121B to the light emitting layers 123A and 123B and consequently use the first semiconductor layer 122 of the lower resistance value.

Modification Example 3

FIGS. 17A and 17B schematically illustrate a configuration of the light emitting device 12A according to modification example 3 of the above-described embodiment. FIG. 17A illustrates a cross-sectional configuration of the light emitting device 12A, and FIG. 17B illustrates a planar configuration of the light emitting device 12A. Thus, the first face S1 of the light emitting device 12A may be provided with three or more electrically-separated conductive films (the conductive film A121A, the conductive film B121B, and a conductive film C121C). The light emitting device 12A according to modification example 3 has a configuration and an effect similar to those of the light emitting device 12A according to the above-described embodiment except this point.

This light emitting device 12A includes the conductive film A121A at the middle of the first face S1, and includes the conductive film B121B and the conductive film C121C of frame shapes around this conductive film A121A in this order. In other words, the conductive film A121A, the conductive film B121B, and the conductive film C121C are disposed in order from an inner side of the first face. In this case, the current density of the current flowing to the light emitting layer 123 via the conductive film A121A, the conductive film B121B, and the conductive film C121C is the highest in the conductive film A121A, and becomes smaller in order of the conductive film B121B and the conductive film C121C. Thus, by increasing the number of conductive films provided on the first face S1, it is possible to vary the magnitude of the current density in a finer manner. The conductive film A121A in the light emitting device 12A is coupled to the wiring line 126, and the conductive film A121A functions as the first electrode. In this case, one or more conductive films (the conductive film B121B and the conductive film C121C) are non-selected electrodes.

The wiring line 126 may be coupled to the conductive film B121B out of the conductive film A121A, the conductive film B121B, and the conductive film C121C to provide the light emitting device 12B. Alternatively, the wiring line 126 may be coupled to the conductive film C121C out of the conductive film A121A, the conductive film B121B, and the conductive film C121C to provide the light emitting device.

A light emitting device (light emitting device 12D) provided by coupling the wiring line 126 to two conductive films out of the conductive film A121A, the conductive film B121B, and the conductive film C121C may be used other than the light emitting devices 12A and 12B described in the above embodiment.

FIG. 18 illustrates one example of a schematic planar configuration of the light emitting device 12D. For example, the conductive film A121A and the conductive film B121B in the light emitting device 12D are coupled to the wiring line 126, and receive a supply of a potential. That is, the conductive film A121A and the conductive film B121B function as the first electrodes, and the conductive film C121 is a non-selected electrode. The conductive film A121A and the conductive film C121 may function as the first electrodes, or the conductive film B121B and the conductive film C121 may function as the first electrodes. Thus, two or more conductive films (the conductive film A121A, the conductive film B121B, and the conductive film C121C) may function as the first electrodes.

As with the present modification example, the first face S1 of the light emitting device 12A may be provided with three or more electrically-separated conductive films (the conductive film A121A, the conductive film B121B, and the conductive film C121C). In this case, it is also possible to obtain the equivalent effect to that of the above-described embodiment. Furthermore, by providing the conductive film C121C in addition to the conductive film A121A and the conductive film B121B, it is possible to make finer adjustment of the magnitude of the current density.

Modification Example 4

FIG. 19 schematically illustrates a planar configuration of the light emitting device 12A according to modification example 4 of the above-described embodiment. Thus, the planar shapes of the conductive film A121A and the conductive film B121B may be circular. The light emitting device 12A according to modification example 4 has a configuration and an effect similar to those of the light emitting device 12A according to the above-described embodiment except this point.

The conductive film A121A is provided at, for example, the middle of the first face S1. A planar shape of the conductive film A121A is circular. The planar shape of the conductive film B121B is, for example, a circular frame shape which surrounds the periphery of this conductive film A121A. The centers of the conductive film A121A and the conductive film B121B are disposed at, for example, the center of the first face S1 in the plan view. That is, the conductive film A121A and the conductive film B121B have higher symmetry. This makes it possible to obtain higher light distribution characteristics. For example, the electrode area of the conductive film B121B is larger than the electrode area of the conductive film A121A. The current density of the current flowing via the conductive film B121B is smaller than the current density of the current flowing via the conductive film A121A.

As with the present modification example, the planar shapes of the conductive film A121A and the conductive film B121B may be circular. In this case, it is also possible to obtain the equivalent effect to that of the above-described embodiment. Furthermore, by enhancing the symmetry of the planar shapes of the conductive film A121A and the conductive film B121B, it is possible to further enhance the light distribution characteristics.

Modification Example 5

FIG. 20 schematically illustrates a planar configuration of a display panel (display panel 10C) according to modification example 5 of the above-described embodiment. The display panel 10C includes both of the light emitting device 12A and the light emitting device 12B. Thus, the light emitting device 12A and the light emitting device 12B may be provided in the one display panel 10C in a mixed manner. The display panel 10C may include the light emitting device 12C (FIG. 12) or the light emitting device 12D (FIG. 18). Thus, the shape or the constituent material of the first electrodes (conductive films A121A) of a portion of the light emitting devices (e.g., light emitting devices 12A) provided in the display panel 10C may be different from the shape or the constituent material of the first electrodes (conductive films B121B) of the other light emitting devices (e.g., light emitting devices 12B). In this case, it is also possible to obtain the equivalent effect to that of the above-described embodiment.

Application Examples

The display 1 described in the above embodiment and the like are applicable to electronic apparatuses in various fields which display image signals inputted from an outside or image signals generated inside as images or video images, such as television apparatuses, digital cameras, laptop personal computers, mobile terminal apparatuses such as mobile telephones, or video cameras. One of these examples will be described below.

FIG. 21 illustrates an external appearance of the television apparatus to which the display 1 according to the above-described embodiment is applied. This television apparatus includes, for example, an image display screen 300 which includes a front panel 310 and a filter glass 320. The above-described display 1 is used for the image display screen 300.

The present technology has been described above with reference to the embodiment and the modification examples. However, the present technology is not limited to the embodiment and the like, and is able to be variously modified. For example, the material and the thickness of each portion described in the above embodiment and the like are not limited thereto, and may be other materials and other thicknesses.

Furthermore, the arrangement of the conductive film A121A and the conductive film B121B on the first face S1 is not limited to that illustrated in FIG. 6B and other drawings. For example, as illustrated in FIG. 22, each side of the first face S1 and each vertex of the conductive film A121A and the conductive film B121B may be opposed in the plan view.

Furthermore, the planar shape of the conductive film B121B may not be a frame shape. For example, as illustrated in FIG. 23, the conductive film A121A may be provided between a plurality of conductive films B121B (the two conductive films B121B in FIG. 23).

Furthermore, the light emitting devices 12A, 12B, 12C, and 12D may be light emitting devices which emit, for example, light in a red wavelength range.

In addition, the display 1 may include one display panel (the display panel 10A, 10B, or 10C).

It is to be noted that the effects disclosed in this description are mere examples and are non-limiting, and, furthermore, other effects may be provided.

It is to be noted that the present technology is also able to employ the following configurations.

(1)
A light emitting device, including:
a light emitting layer that is provided between a first face and a second face;
a first electrode that is provided on the first face and is electrically coupled to the light emitting layer;
a second electrode that is provided on the second face and is electrically coupled to the light emitting layer; and
a non-selected electrode that is provided on the first face and is in a state not electrically coupled to a potential supply source.

(2)
The light emitting device according to (1), in which the first electrode and the non-selected electrode differ from each other in electrode area.

(3)
The light emitting device according to (1), in which the first electrode and the non-selected electrode differ from each other in planar shape.

(4)
The light emitting device according to (1), in which the first electrode and the non-selected electrode differ from each other in constituent material.

(5)
The light emitting device according to any one of (1) to (4), further including:
a first semiconductor layer between the first electrode and the light emitting layer; and
a second semiconductor layer between the second electrode and the light emitting layer.

(6)
The light emitting device according to (5), in which the first electrode and the non-selected electrode are disposed in respective regions, of the first face, different from each other.

(7)
The light emitting device according to (6), in which a portion that overlaps the first electrode and a portion that overlaps the non-selected electrode are electrically separated in the light emitting layer and the first semiconductor layer.

(8)
The light emitting device according to any one of (1) to (7), in which the first electrode and the non-selected electrode have respective rotationally-symmetrical shapes in a plan view.

(9)
The light emitting device according to any one of (1) to (8), in which a planar shape of one of the first electrode and the non-selected electrode is a quadrangular shape.

(10)
The light emitting device according to (9), in which another one of the first electrode and the non-selected electrode surrounds the quadrangular shape.

(11)
The light emitting device according to any one of (1) to (8), in which a planar shape of one of the first electrode and the non-selected electrode is circular.

(12)
The light emitting device according to any one of (1) to (11), in which the light emitting layer includes InGaN.

(13)
The light emitting device according to any one of (1) to (12), further including a switching device that is coupled to the first electrode and the non-selected electrode, in which the switching device is operable to supply a potential to the first electrode.

(14)
The light emitting device according to any one of (1) to (13), in which the first electrode, the non-selected electrode, or both include a plurality of conductive films.

(15)
A display, including a display panel that includes a mounting substrate, and a plurality of light emitting devices provided on the mounting substrate,
the light emitting devices each including
a light emitting layer that is provided between a first face and a second face,
a first electrode that is provided on the first face and is electrically coupled to the light emitting layer,
a second electrode that is provided on the second face and is electrically coupled to the light emitting layer, and a non-selected electrode that is provided on the first face and is in a state not electrically coupled to a potential supply source.

(16)

The display according to (15), in which all of the light emitting devices provided on the mounting substrate include the first electrodes of same shapes.

(17)

The display according to (15), in which all of the light emitting devices provided on the mounting substrate include the first electrodes including a same constituent material.

(18)

The display according to (15), in which a portion of the plurality of light emitting devices provided on the mounting substrate have shapes of the first electrodes different from shapes of the first electrodes of another light emitting device.

(19)

The display according to any one of (15) to (18), in which a plurality of the display panels is closely laid in a tile pattern.

The present application is based on and claims priority from Japanese Patent Application No. 2017-111525 filed with the Japan Patent Office on Jun. 6, 2017, the entire contents of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light emitting device, comprising:
   a first face;
   a second face opposite to the first face;
   a first semiconductor layer;
   a second semiconductor layer;
   a light emitting layer between the first semiconductor layer and the second semiconductor layer;
   a first electrode on the first face;
   a second electrode on the second face, wherein
      each of the first electrode and the second electrode is electrically coupled to the light emitting layer,
      the first semiconductor layer is between the first electrode and the light emitting layer, and
      the second semiconductor layer is between the second electrode and the light emitting layer;
   a non-selected electrode on the first face, wherein the non-selected electrode is not electrically coupled to a potential supply source; and
   a groove between the first electrode and the non-selected electrode, wherein
      the groove electrically separates the first electrode and the non-selected electrode;
   wherein at least one of the first electrode or the non selected electrode includes a plurality of conductive films and
   wherien a constituent material of the first electrode is different from a constituent material of the non selected electrode.

2. The light emitting device according to claim 1, wherein an area of the first electrode is different from an area of the non-selected electrode.

3. The light emitting device according to claim 1, wherein a planar shape of the first electrode is different from a planar shape of the non-selected electrode.

4. The light emitting device according to claim 1, wherein the first electrode is on a first region of the first face, the non-selected electrode is on a second region of the first face, and
the first region is different from the second region.

5. The light emitting device according to claim 4, wherein
a first portion of each of the light emitting layer and the first semiconductor layer overlaps the first electrode,
a second portion of each of the light emitting layer and the first semiconductor layer overlaps the non-selected electrode, and
the first portion is electrically separated from the second portion.

6. The light emitting device according to claim 1, wherein the first electrode and the non-selected electrode have respective rotationally-symmetrical shapes in a plan view.

7. The light emitting device according to claim 1, wherein a planar shape of one of the first electrode or the non-selected electrode is a quadrangular shape.

8. The light emitting device according to claim 7, wherein another one of the first electrode or the non-selected electrode surrounds the quadrangular shape.

9. The light emitting device according to claim 1, wherein a planar shape of one of the first electrode or the non-selected electrode is circular.

10. The light emitting device according to claim 1, wherein the light emitting layer includes InGaN.

11. The light emitting device according to claim 1, further comprising a switching device coupled to each of the first electrode and the non-selected electrode, wherein the switching device is configured to supply a potential to the first electrode.

12. A display, comprising:
   a display panel that includes a mounting substrate; and
   a plurality of light emitting devices on the mounting substrate, wherein each of the plurality of light emitting devices includes:
      a first face;
      a second face opposite to the first face;
      a first semiconductor layer;
      a second semiconductor layer;
      a light emitting layer between the first semiconductor layer and the second semiconductor layer;
      a first electrode on the first face;
      a second electrode on the second face, wherein
         each of the first electrode and the second electrode is electrically coupled to the light emitting layer,
         the first semiconductor layer is between the first electrode and the light emitting layer, and
         the second semiconductor layer is between the second electrode and the light emitting layer;
      a non-selected electrode on the first face, wherein the non-selected electrode is not electrically coupled to a potential supply source; and
      a groove between the first electrode and the non-selected electrode, wherein
         the groove electrically separates the first electrode and the non-selected electrode,
   wherein at least one of the first electrode or the non selected electrode includes a plurality of conductive films and
   wherien a constituent material of the first electrode is different from a constituent material of the non selected electrode.

13. The display according to claim 12, wherein the first electrode of each of the plurality of light emitting devices has a same shape.

14. The display according to claim 12, wherein the first electrode of each of the plurality of light emitting devices comprises a same constituent material.

15. The display according to claim 12, wherein
the first electrode of each of a first set of light emitting devices of the plurality of light emitting devices has a first shape, and
the first electrode of each of a second set of light emitting devices of the plurality of light emitting devices has a second shape different from the first shape.

16. The display according to claim 12, further comprising a plurality of display panels in a tile pattern.

* * * * *